(12) United States Patent
Shiigi

(10) Patent No.: US 8,999,814 B2
(45) Date of Patent: Apr. 7, 2015

(54) SEMICONDUCTOR DEVICE FABRICATING METHOD

(71) Applicant: Fuji Electric Co., Ltd., Kawasaki-shi (JP)

(72) Inventor: Takashi Shiigi, Matsumoto (JP)

(73) Assignee: Fuji Electric Co., Ltd., Kawasaki-Shi (JP)

( * ) Notice: Subject to any disclaimer, the term of this patent is extended or adjusted under 35 U.S.C. 154(b) by 0 days.

(21) Appl. No.: 14/251,086

(22) Filed: Apr. 11, 2014

(65) Prior Publication Data

US 2014/0315352 A1   Oct. 23, 2014

(30) Foreign Application Priority Data

Apr. 17, 2013   (JP) .................. 2013-086324

(51) Int. Cl.

| | | |
|---|---|---|
| H01L 21/30 | (2006.01) | |
| H01L 23/00 | (2006.01) | |
| H01L 21/66 | (2006.01) | |
| H01L 27/02 | (2006.01) | |
| H01L 23/31 | (2006.01) | |
| H01L 21/56 | (2006.01) | |

(52) U.S. Cl.
CPC ............. *H01L 24/85* (2013.01); *H01L 23/3157* (2013.01); *H01L 21/561* (2013.01); *H01L 22/34* (2013.01); *H01L 24/05* (2013.01); *H01L 24/45* (2013.01); *H01L 24/48* (2013.01); *H01L 2224/05624* (2013.01); *H01L 2224/45124* (2013.01); *H01L 2224/48472* (2013.01); *H01L 2224/48724* (2013.01); *H01L 2924/00014* (2013.01); *H01L 2924/10253* (2013.01); *H01L 2924/13055* (2013.01); *H01L 27/0203* (2013.01)

(58) Field of Classification Search
CPC .......... H01L 2924/01079; H01L 2924/01078; H01L 2924/01029; H01L 2924/01013; H01L 2924/14
USPC ......... 438/124, 106–107, 109, 110, 112, 113, 438/127, 613, 459, 458, 622, 695
See application file for complete search history.

(56) References Cited

U.S. PATENT DOCUMENTS

| | | | |
|---|---|---|---|
| 2003/0153192 A1* | 8/2003 | Suthar et al. ................. | 438/695 |
| 2011/0089522 A1 | 4/2011 | Narazaki | |
| 2011/0244604 A1 | 10/2011 | Narazaki et al. | |

FOREIGN PATENT DOCUMENTS

| | | |
|---|---|---|
| JP | 2000-114334 A | 4/2000 |
| JP | 2006-196710 A | 7/2006 |
| JP | 2009-218343 A | 9/2009 |

* cited by examiner

*Primary Examiner* — Hoa B Trinh
(74) *Attorney, Agent, or Firm* — Manabu Kanesaka

(57) ABSTRACT

A semiconductor device fabricating method includes forming device chip regions and a monitor chip region for processing management, on a substrate surface layer on one main surface side of a semiconductor substrate wafer, each device chip region having an active region and an edge region; after forming metal films on front surface of the device chip regions and the monitor chip region by vapor deposition and photolithography, forming protective films on the front surfaces of the device chip regions and monitor chip region; and grinding and polishing another main surface side of the semiconductor substrate wafer to thin the semiconductor substrate wafer. A difference between an area of one chip occupied by the protective film of the monitor chip region and an area of one chip occupied by the protective film of the device chip region is 20% or less.

8 Claims, 9 Drawing Sheets

Fig. 3A

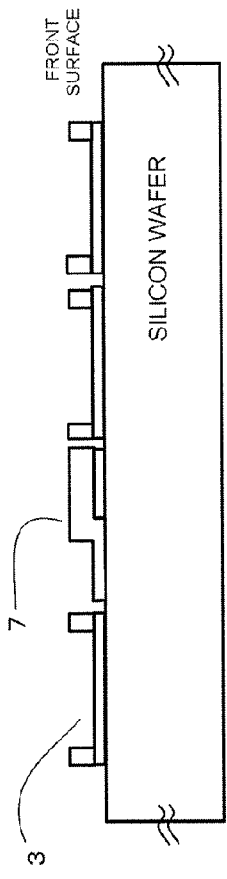

Fig. 3B

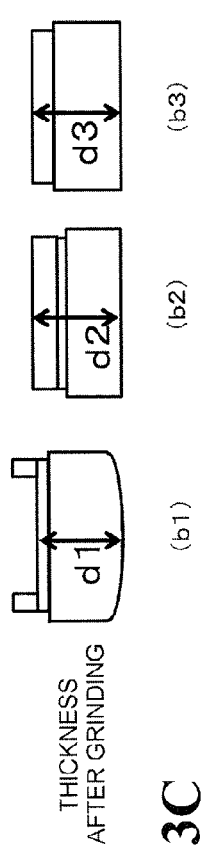

THICKNESS AFTER GRINDING

Fig. 3C

(b1) THICKNESS d1 AFTER BACK SURFACE GRINDING = SILICON THICKNESS + METAL FILM THICKNESS (b2) THICKNESS d2 AFTER BACK SURFACE GRINDING = SILICON THICKNESS + METAL FILM THICKNESS + PROTECTIVE FILM THICKNESS (b3) THICKNESS d3 AFTER BACK SURFACE GRINDING = SILICON THICKNESS + PROTECTIVE FILM THICKNESS

AS d1 = d2 = d3, AND METAL FILM THICKNESS < PROTECTIVE FILM THICKNESS AFTER BACK SURFACE GRINDING, THE SILICON THICKNESS AFTER BACK SURFACE GRINDING IS SUCH THAT b1 > b3 > b2

Fig. 5

| DEVICE CHIP TYPE | AREA OF METAL FILM ETCHED/CHIP AREA (%) | | DEVICE CHIP REGION METAL FILM ETCHING DEFECTS |
|---|---|---|---|
| | DEVICE CHIP REGION | MONITOR CHIP REGION | |
| TYPE A | 8.5% | 77.6% | YES |
| TYPE B | 10.9% | 27.5% | NO |
| TYPE C | 4.0% | 24.5% | NO |
| TYPE D | 7.1% | 37.4% | NO |
| TYPE E | 6.4% | 33.3% | NO |

Fig. 9
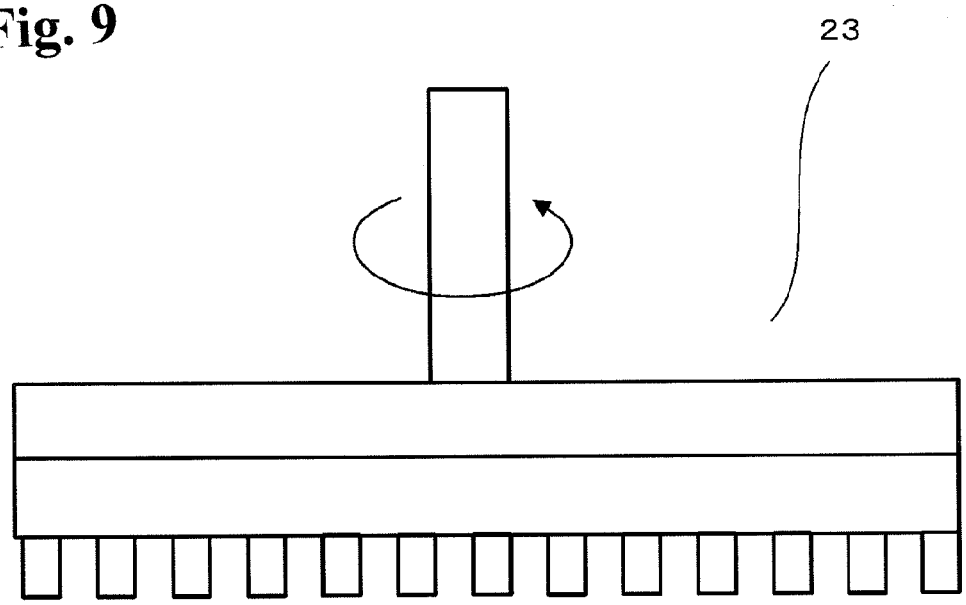
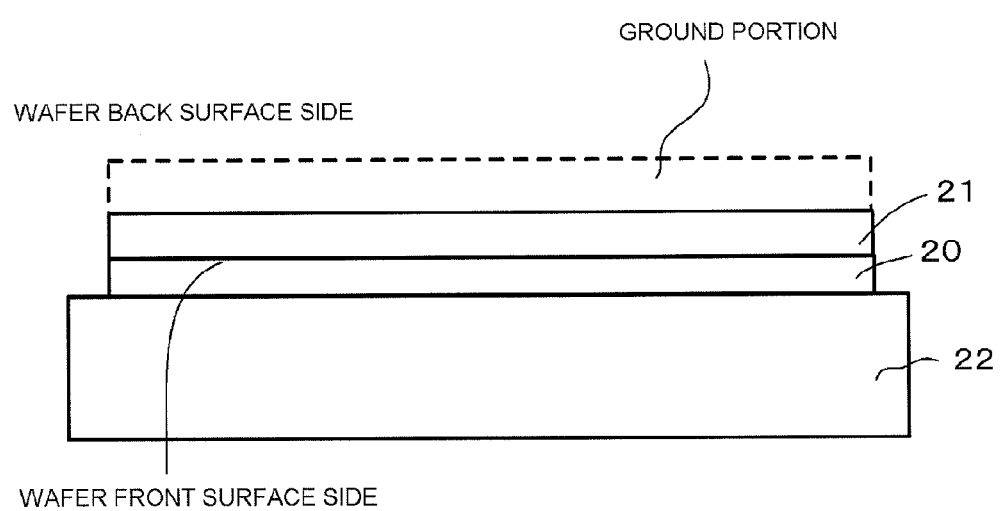

SEMICONDUCTOR DEVICE FABRICATING METHOD

RELATED APPLICATIONS

The present application claims priority from Japanese Application No. 2013-086324 filed Apr. 17, 2013.

BACKGROUND OF THE INVENTION

1. Field of the Invention

The present invention relates to a fabricating method of a semiconductor device such as an insulated gate bipolar transistor (IGBT) or free wheeling diode (FWD) mounted in a power module or the like, and in particular, relates to a semiconductor device fabricating method including in a wafer processing of the semiconductor device a step of grinding the back surface of the wafer in order to obtain a wafer thickness commensurate with the breakdown voltage.

2. Description of the Prior Art

An IGBT, FWD, or the like, mounted in a power module or the like is widely used from commercial fields such as general-purpose inverters, AC servos, uninterruptible power supplies (UPS), and switching power supplies to consumer equipment fields such as microwave ovens, rice cookers, and strobe lights. Furthermore, there is a demand from the market to reduce further loss in IGBTs and FWDs, such as reducing on-state voltage, in order to expand the field of application. A fabricating method whereby the thickness of a semiconductor substrate that is thick initially is reduced as far as possible by grinding the wafer from the back surface partway through the wafer processing, within a thickness range allowed by the design breakdown voltage and a fabricating process tolerance range, is known as one effective method of reducing IGBT loss while fabricating with as high production efficiency as possible.

There is a tendency with a power device such as an IGBT or FWD fabricated by a wafer processing according to this kind of fabricating method for the chip thickness (silicon substrate thickness) to be ground ever thinner, within a range that does not cause a decrease in breakdown voltage, in order to improve semiconductor characteristics. A plan view of the whole of a wafer 21 fabricated by this kind of heretofore known wafer processing is shown in FIG. 6, while an enlarged plan array view of the vicinity of a monitor chip region 7a (shown as PCM in FIG. 6) is shown in FIG. 7. A device chip region 3, excluding the monitor chip region 7a, shown in FIGS. 6 and 7 is a region forming a chip of an IGBT, FWD, or the like. Although the monitor chip region 7a cannot be used as a device chip, which is the fabricating object, it is a region used for improving the yield rate by monitoring the wafer processing, is called a process control monitor (PCM), or the like, in the wafer 21, and several are formed in each wafer.

As shown in FIG. 7, electrodes (an IGBT emitter electrode 4, an FWD anode electrode, and the like) formed in an active region 1 in the center of the front surface of the device chip region 3 need a metal film thickness of 3 μm or more, and it is often the case that a protective film (a polyimide resin film 6, or the like, shown by oblique hatching in FIG. 7) formed by coating on an edge region 2 on the periphery of the device chip 3 has a thickness of 10 μm or more. Also, a silicon substrate front surface inside the edge region 2 has a configuration wherein the protective film with a thickness in the region of 10 μm is further deposited on a field plate (not shown) formed of a metal film formed simultaneously with the emitter electrode 4 of the active region 1. Regarding the area ratio over the whole chip, the emitter electrode 4 portion of the active region 1 having no protective film occupies the greater part of the area. Meanwhile, in the monitor chip region 7a, the protective film is applied over the greater part of the region 7a.

Also, the monitor chip region 7a may be used for applying device (an IGBT or the like) characteristic breakdown tests, such as a measurement of the dielectric strength of a gate oxide film 12 (FIG. 8). Also, by a dielectric formed from the first photolithography step onward after carrying out a depositing of a dielectric using a CVD method being left in the monitor chip region 7a, the monitor chip region 7a may also be used when a problem is discovered in a subsequent step to easily identify the step in which the problem has occurred due to a foreign object, or the like, by analyzing the dielectric left in the monitor chip region 7a.

Furthermore, as it is possible to carry out cause analysis by analyzing the foreign object, or the like, and thus possible to carry out feedback to the step in which the problem has occurred, there is an advantage in that the cause can be easily eliminated. As a result of this, the reliability of the semiconductor device increases, and defective articles decrease, because of which fabricating yield increases (JP-A-2000-114334 (paragraph 0024)). Furthermore, in addition to the previous description, a photoalignment marker, a test element group (TEG) for monitoring gate breakdown voltage, a PCM for managing trends such as those in oxide film thickness and sheet resistivity, and the like, may be provided in the monitor chip region 7a. Furthermore, a miniature chip or the like may be provided in order to manage electrical characteristics such as on-state voltage (JP-A-2011-216764 (abstract, problems)) or reduce etching variation by managing etching variation (JP-A-2011-86771 (paragraph 0037)).

In the monitor chip region 7a, after a metal film is applied to a thickness of 5 μm over the whole of the wafer by sputter deposition or the like, the metal film is removed by etching, leaving only the metal film in a sensor contact region 10 inside a sensing region 9a shown by a central rectangular frame (broken lines). The lattice form lines inside the sensing region 9a shown in FIG. 7 are the dielectric pattern left for the previously described object. All of the metal film on the outer side of the sensing region 9a is removed by etching. Furthermore, a protective film (a polyimide resin film 6a) of a thickness of 10 μm is applied to the front surface of the sensing region 9a, other than the sensor contact region 10, and an outer side region of the sensing region 9a. Consequently, the monitor chip region 7a has a protruding form with a surface thickness greater than that of the larger part of the device chip region 3 (thickness 5 μm) on the wafer front surface.

With regard to a wafer with this kind of front surface condition, in order to reduce uneven grinding in the wafer plane, which is a problem when grinding the back surface, there is known a method wherein back surface grinding is carried out after the unevenness on the wafer front surface side, which is a caused by the uneven grinding, is aligned to the same level using chemical mechanical polishing (CMP) technology (JP-A-2009-218343 (paragraph 0058)). Furthermore, there is also a document describing a method wherein a thick surface protection tape is attached to the front surface of a semiconductor wafer having irregularities due to a polyimide protective film, and heated to deform the surface protection tape and form a practically even front surface (JP-A-2006-196710 (abstract)).

SUMMARY OF THE INVENTION

Wafer processing for fabricating a power device such as the previously described IGBT or FWD initially uses a thick wafer due to concerns about wafer cracking and the like, and after the formation of a semiconductor function region formed on the front surface side of the wafer, a back surface grinding step for thinning the wafer is needed. In the back surface grinding step, as shown in FIG. 9, after a protective tape 20 is attached to protect the front surface side of the wafer 21, and furthermore is fixed to a support board 22, the wafer 21 back surface side, which is the opposite side surface, is turned upward, and the back surface side of the wafer 21 is ground using a grinding wheel 23 including a grind stone on the contact surface by pressing the grinding wheel 23 against the wafer 21 while causing the grinding wheel 23 to rotate. In the event that there is irregularity on the front surface side of the wafer 21 at this time, the amount of back surface grinding may differ between a protruding portion and a depressed portion (a large amount of back surface grinding in a protruding portion and a small amount in a depressed portion), and a problem occurs in that the back surface grinding of the silicon substrate is not carried out evenly. It is known that this problem becomes particularly bigger when grinding and polishing a wafer with a diameter of five inches or more, wherein the breakdown voltage is low, and the silicon substrate thickness is 100 μm or less. As a wafer having on the front surface thereof an unevenness in which this kind of problem is likely to occur, there is the wafer 21 having the monitor chip region 7a. As the pattern layout formed in the chip differs between the device chip region 3 (IGBT chip region) and monitor chip region 7a, as previously described, unevenness occurs on the wafer front surface side. A cause of this kind of unevenness is the difference in height occurring due to the combination of the metal film formed on the silicon substrate and the existence of the protective film stacked on the metal film. For example, as previously described, the device chip region 3 (IGBT chip region) has a configuration in which the larger part of the central portion thereof is a metal film with a thickness of 5 μm, while a field plate formed of a metal film with a thickness of 5 μm and the protective film with a thickness in the region of 10 μm are stacked in the peripheral portion edge region. Meanwhile, the protective film (the 10 μm thick polyimide resin film 6a) occupies the greater part of the monitor chip region 7a. The only regions without the protective film (the polyimide resin film 6a) are the plurality of narrow sensor contact regions 10 (FIG. 7).

That is, the formation conditions of the 5 μm thick metal films and 10 μm thick protective films formed on the front surface of the device chip region 3 and monitor chip region 7a are summarized as below.

TABLE 1

|  | In Device Chip Region 3 | In Monitor Chip Region 7a |
| --- | --- | --- |
| Metal film formation region | Active region and one portion of edge region | Small area sensor contact region |
| Protective film formation region | Edge region | Larger part of regions other than sensor contact region |

As previously described, however, according to the back surface grinding, a chip thickness (net silicon substrate thickness) A is reduced by grinding during the wafer processing, but as there is no difference before and after the back surface grinding in a thickness B, which is a combination of the front surface side field plate and protective film, the ratio B/A increases after the back surface grinding. Moreover, in the case of processing specifications to reduce the chip thickness (silicon thickness) by the back surface grinding to a thickness near that necessary for the design breakdown voltage of the device, when the variation in the wafer thickness occurs after the back surface grinding, a region in which the silicon thickness is at or below a limit thickness determined by the breakdown voltage is formed to cause an effect on electrical characteristics, such as a decrease in breakdown voltage. For example, in the back surface grinding of the wafer having the regular device chip region 3 and monitor chip region 7a shown in FIG. 7, because of the effect of the monitor chip region 7a being grinded excessively due to a thick front surface region forming a protruding portion, the chip thickness (silicon thickness) of the regular device chip regions 3 disposed on the outer side periphery of the monitor chip region 7a is also likely to be reduced excessively. As a result, the breakdown voltage of the regular device chip region 3 decreases, breakdown voltage defects are likely to occur, and the yield rate decreases.

Further, when comparing the metal films formed on the chip front surface in the regular device chip region 3 and monitor chip region 7a, the area of the monitor chip region 7a occupied by the metal film is far smaller than the area of the regular device chip region 3 occupied by the metal film. Because of this, the area of the metal film removed by etching is extremely large in the monitor chip region 7a, and the amount of heat generated by etching is also large. It is known that there is also a problem in that etching is likely to be precipitated by this heat, as a result of which the etching conditions of the peripheral device chip regions 3 surrounding the monitor chip region 7a change, and metal film etching defects increase.

The invention, having been contrived taking into consideration the points heretofore described, has an object of providing a semiconductor device fabricating method that can reduce defects caused by the monitor chip region, such as breakdown voltage defects and metal film etching defects.

In order to achieve the object, the invention is a semiconductor device fabricating method including a first step of forming a device chip region having a required active region and an edge region surrounding the active region, and a monitor chip region for processing management including in the center a sensing region, in a substrate surface layer in a region compartmentalized in lattice form on one main surface side of a semiconductor substrate wafer; a second step of, after forming a metal film of a required pattern on a front surface of the device chip region and the monitor chip region by vapor deposition and photolithography, forming a protective film on the front surface of each of the device chip region and the monitor chip region; and a third step of thinning the semiconductor substrate wafer by grinding and polishing the other main surface side of the semiconductor substrate wafer. A difference between an area of one chip occupied by the protective film of the monitor chip region and an area of one chip occupied by the protective film of the device chip region is 20% or less. It is preferable that the pattern of the protective film formed in the monitor chip region is same as the pattern of the protective film formed in the device chip region. It is preferable that the protective film is formed in peripheral regions of the device chip region and the monitor chip region. It is preferable that the areas occupied by the protective film in the device chip region and the monitor chip region are 30% or less. It is preferable that the protective film is a polyimide resin film. It is preferable that the film thickness of a region stacked with the metal film and the protective film formed in the second step is 10 μm or more. It is preferable that the ratio after the third step between a thickness A of the semiconductor substrate wafer and a film thickness B of the region stacked with the metal film and protective film satisfies B/A>7.7%. Also, it is preferable that the areas occupied by the metal film in the device chip region and monitor chip region are each 62.6% or more.

According to the semiconductor device fabricating method of the invention, the difference between the conditions of the device chip region and monitor chip region is reduced in each kind of step, such as the back surface grinding step and metal film etching step; therefore, it is possible to reduce the defects caused by the existence of the monitor chip region casing breakdown voltage defects and metal film etching defects.

BRIEF DESCRIPTION OF THE DRAWINGS

FIG. 3A is a cross-sectional view of the wafer in the vicinity of the device chip region and monitor chip region before back surface grinding, FIG. 3B is a cross-sectional view of each of the device chip region and monitor chip region after back surface grinding; and FIG. 3C is a diagram explaining the evenness of the thickness of the silicon wafer after back surface grinding.

FIG. 5 is a table showing the relationship between the ratio of the area of a metal film subjected to etching with respect to the chip area and metal film etching defects in the device chip regions peripheral to the monitor chip region according to the first aspect of the invention.

FIG. 9 is a cross-sectional view showing a condition wherein a wafer is attached to a grinding device (schematic cross-sectional view) used in a back surface grinding step.

DETAILED DESCRIPTION OF THE INVENTION

Figure 1:
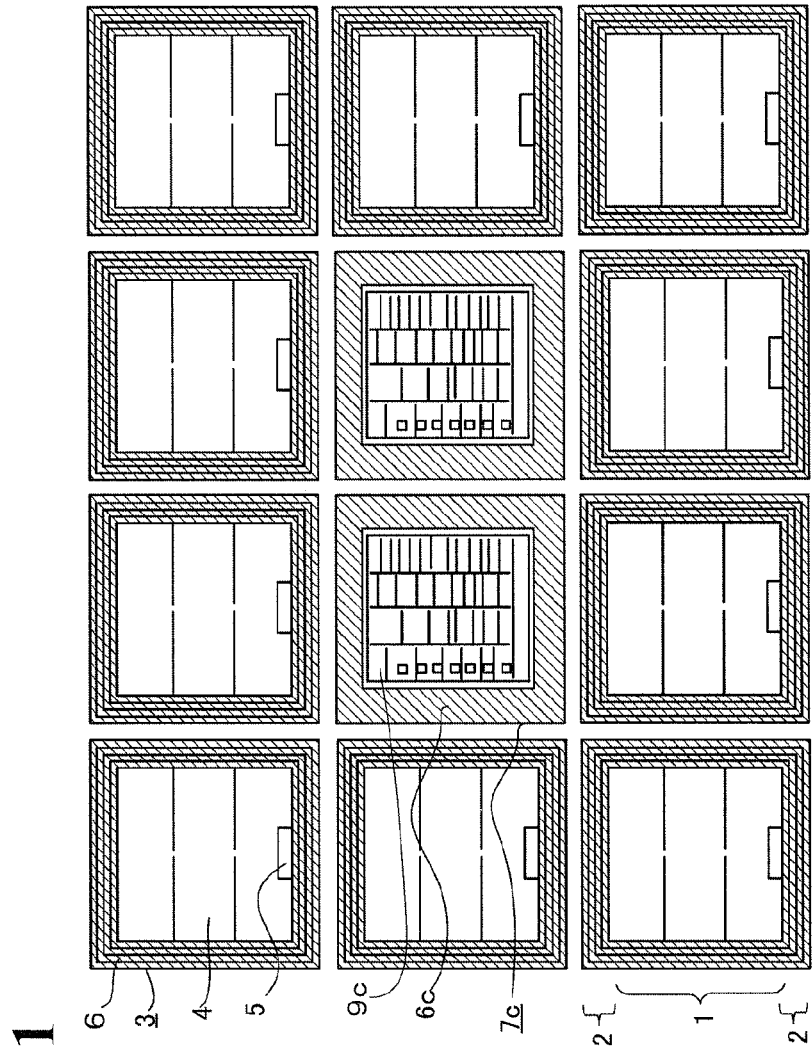
FIG. 1 is an enlarged plan view wherein monitor chip regions and device chip regions peripheral thereto are arrayed in lattice form on the front surface of a wafer according to a first aspect of the invention.

Hereafter, a detailed description will be given, referring to the drawings, of an example according to a semiconductor device fabricating method of the invention. In the specification and attached drawings, the same reference signs are given to the same configurations in the following example description and attached drawings, and redundant descriptions will be omitted. Also, for ease of viewing and understanding, the attached drawings described in the example are not drawn to an exact scale or dimensional ratio. Provided that the scope of the invention is not exceeded, the invention is not limited to the details of the example described hereafter.

EXAMPLE 1

Hereafter, a description will be given of the semiconductor device fabricating method of the invention, particularly an IGBT wafer processing including a step of reducing the thickness of a semiconductor substrate, referring to the wafer processing step flowchart of FIG. 2 and to FIGS. 1 to 9, with the exception of FIG. 7.

Figure 2:
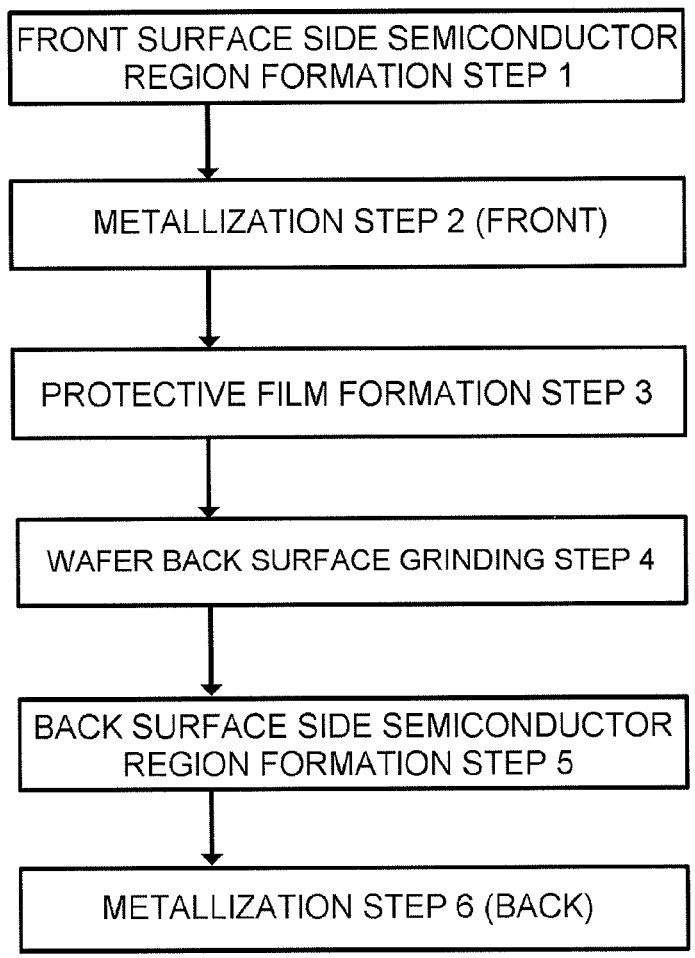
FIG. 2 is a semiconductor wafer processing flow chart.
Figure 6:
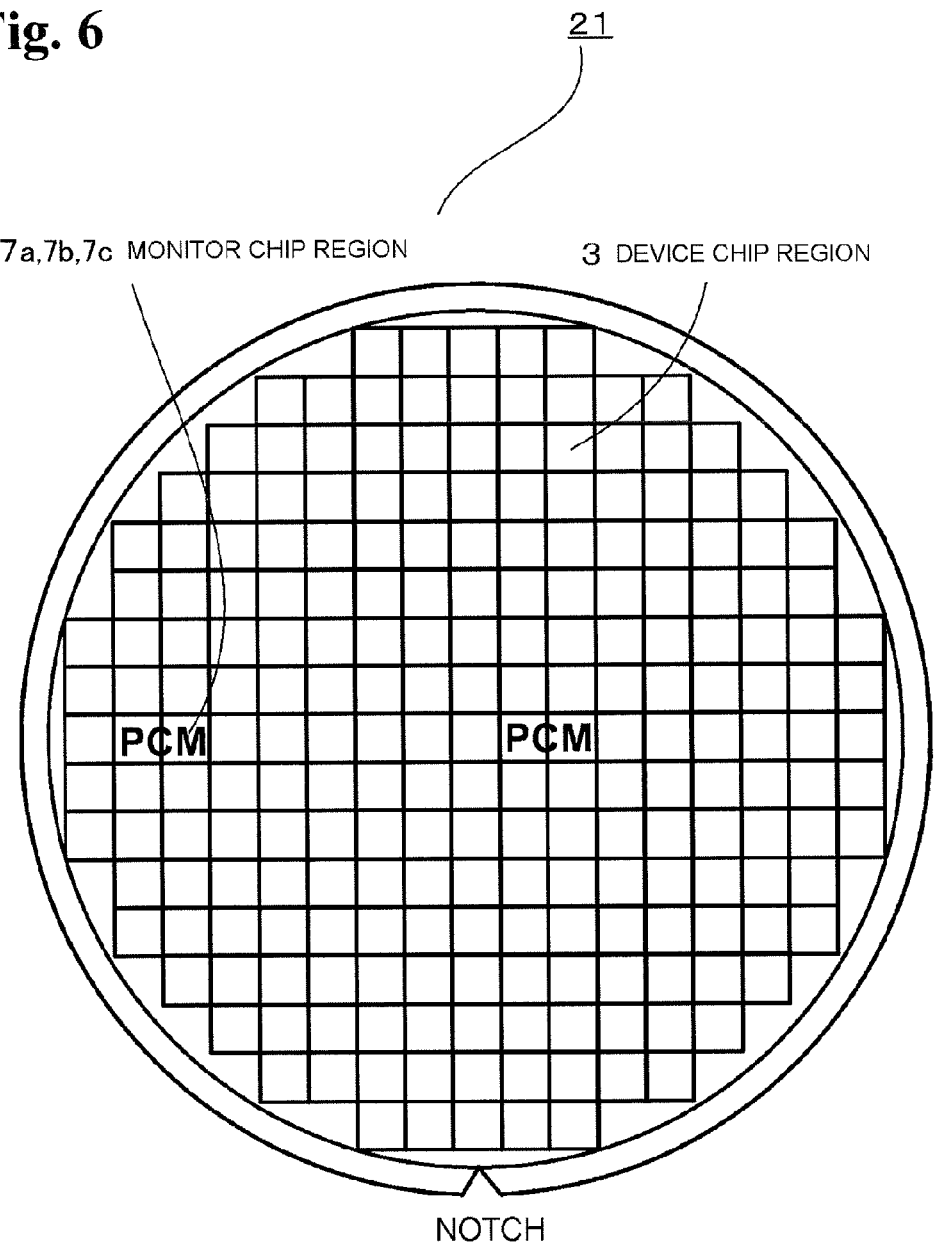
FIG. 6 is a plan view of a wafer showing a disposition example of a lattice form array of front surface side device chip regions and monitor chip regions therein according to the invention and a heretofore known example.
Figure 7:
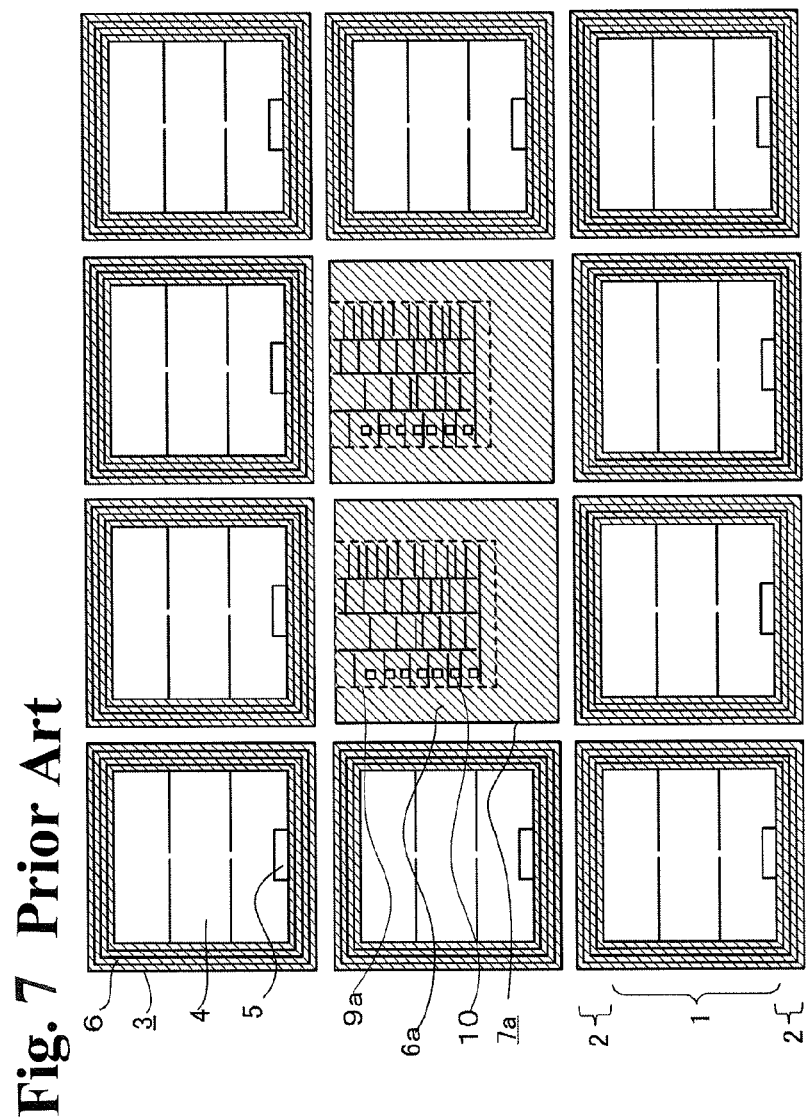
FIG. 7 is an enlarged plan view wherein chips are arrayed in a lattice form of monitor chip regions and device chip regions peripheral thereto on the front surface of a heretofore known wafer.

In step 1 of FIG. 2, a front surface side semiconductor region including a MOS gate structure 13 (FIG. 8) formed via heretofore known processing steps such as a photolithography step, ion implantation, thermal diffusion, oxidation, and a deposition step is formed in each device chip region 3 on the front surface side of a wafer 21 (FIG. 6). The front surface side semiconductor region has in the center thereof an active region 1 (FIGS. 1, 4, 6, and 8) including the MOS gate structure 13, and has an edge region 2 (FIGS. 1 and 4) on the outer periphery thereof. A plurality of the device chip regions 3 (FIGS. 1 and 4) is formed in a lattice form chip array pattern, as shown in a plan view of the wafer 21 in FIG. 6 and in enlarged plan array views of the wafer in FIGS. 1 and 4. An emitter electrode 4, a gate electrode pad 5, gate electrode wiring (not shown), and the like, are formed of an aluminum alloy film serving as a metal film in the active region 1 (a metallization step 2). Protective films such as polyimide resin films 6b and 6c are applied on the chip periphery portion (the edge region 2) surrounding the emitter electrode 4, gate electrode pad 5, and the like, of the chip center portion (the active region 1), to which aluminum wire is connected by bonding in a subsequent device chip 3 assembly step (a protective film formation step 3). No protective film is formed in the active region 1.

Continuing, a protective tape 20 for protecting the front surface side when grinding the back surface of the wafer 21, using the grinding device used for back surface grinding shown in a schematic cross-sectional view in FIG. 9, is attached to the wafer 21 front surface side and fixed with a support board 22, and the thickness of the back surface of the wafer 21 is reduced to a required thickness determined by the breakdown voltage, and the like, by pressing a rotating grinding wheel 23 against the back surface and grinding and polishing (a wafer back surface grinding step 4). For example, a wafer of a thickness in the region of 650 µm before grinding is reduced to a thickness in the region of 50 µm to 200 µm in accordance with the breakdown voltage in a device with a breakdown voltage of 300 V to 1,700 V. A thin wafer is not used from the start of the wafer processing to reduce a decrease in yield rate due to wafer cracking or chipping to the minimum possible. After performing a finishing etching after the back surface grinding, an n-type field stop layer 8 and p-type collector region 10 are formed on the wafer back surface side, as shown in a main portion cross-sectional view of an IGBT in FIG. 8 (a back surface side semiconductor region formation step 5), and a metal film of Ti—Ni—Au or the like is deposited by sputter deposition or the like, thereby forming a collector electrode 11 (a metallization step 6).

There is a tendency with a power device such as an IGBT or FWD fabricated using this kind of wafer processing for the chip thickness (silicon substrate thickness) to be reduced even further than conventional chips by back surface grinding in order to improve the semiconductor characteristics, but in particular, it is preferable for further reduction in on-state voltage, and the like, that the thickness is reduced to 100 µm or less in a device with a breakdown voltage of 600 V or less.

Meanwhile, electrodes (the IGBT emitter electrode 4, an FWD anode electrode, and the like) formed in the active region 1 in the center of the front surface of the device chip region 3 need a metal film thickness of 3 µm or more, and it is often the case that a protective film (a polyimide resin film 6) formed by coating on the edge region 2 on the periphery of the device chip 3 has a thickness of 10 µm or more. The metal films have a thickness of 3 µm or more to avoid bonding damage extending to the silicon substrate front surface, which is a concern when bonding a thick aluminum wire in which the metal films are thin. As the protective film is deposited by the application of a polyimide resin or the like, a film thickness in the region of 10 µm is adopted, taking into account the point that it is comparatively difficult to keep the film thin at an even thickness including an irregular portion, and the need to reduce the effect of a charge originating on the exterior on breakdown voltage and the reliability thereof. Also, in the edge region 2, in particular, the protective film with a thickness in the region of 10 µm is deposited on a field plate formed of a metal film formed simultaneously with the emitter electrode 4 of the active region 1; however, the active region 1 occupies the greater part of the area.

Meanwhile again, a method whereby processing is managed by monitor chip regions 7b and 7c being provided in the plane of the wafer 21 and feedback is supplied to the processing, thereby increasing the yield rate, is employed for the wafer processing of the semiconductor device according to the example, in the same way as that of the heretofore known. For example, in addition to the usual device chip region 3 (IGBT chip region), several monitor chip regions 7b and 7c, such as process control monitors (PCM), are formed in the wafer 21.

Figure 8:
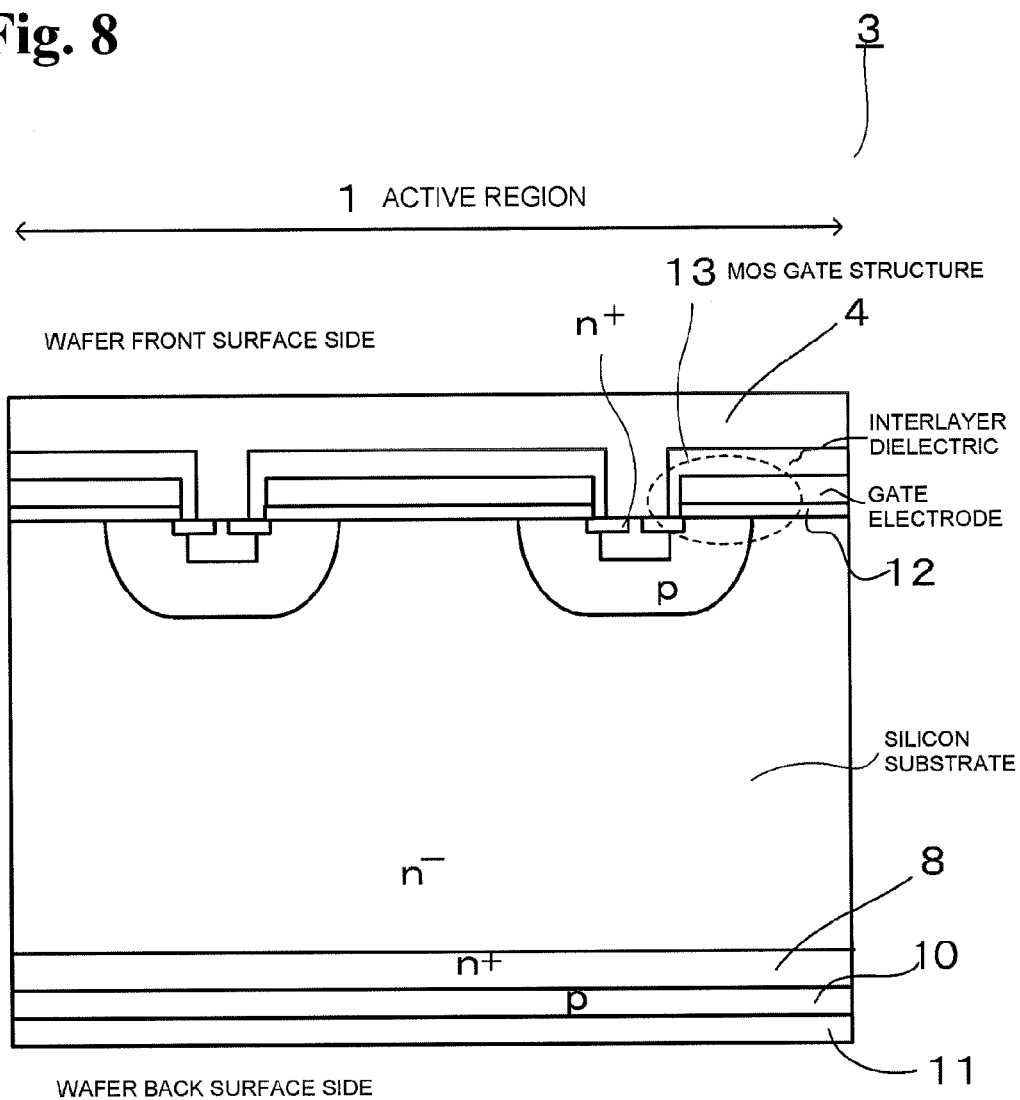
FIG. 8 is a main portion cross-sectional view in an active region of the device chip region of the invention and one heretofore known.

The monitor chip regions 7b and 7c according to the example are used for implementing device characteristic breakdown tests, such as a measurement of the dielectric strength of the gate oxide film 12 (FIG. 8). Also, by a dielectric formed from the first photolithography step onward after a depositing of a dielectric using a CVD method being left inside the monitor chip regions 7b and 7c, the monitor chip regions 7b and 7c can be used when a problem is discovered in a subsequent step to easily identify the step in which the problem has occurred due to a foreign object, or the like, by analyzing the dielectric left in the monitor chip region 7.

Figure 4:
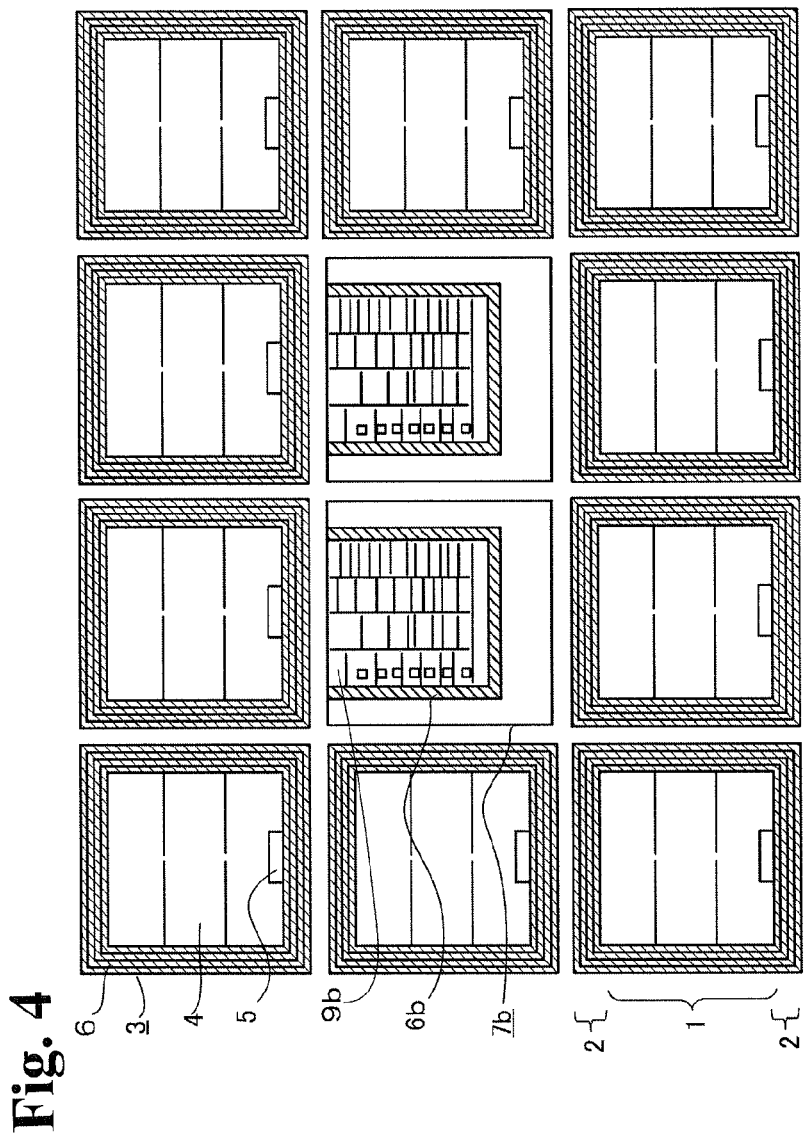
FIG. 4 is an enlarged plan view wherein monitor chip regions and device chip regions peripheral thereto are arrayed in lattice form on the front surface of a wafer according to the first aspect of the invention.

FIGS. 1 and 4 according to the example of the invention are enlarged plan array views of the monitor chip regions 7b and 7c of FIG. 6 and the device chip regions 3 disposed on the periphery thereof. A characteristic of FIGS. 1 and 4 is that regions (oblique hatching) in the monitor chip regions 7b and 7c in which protective films such as the polyimide resin films 6b and 6c are formed occupy a far smaller area than a region (oblique hatching) formed with a polyimide resin film 6a, which is formed over practically the whole surface in a heretofore known monitor chip region 7a in an enlarged plan array view shown in FIG. 7. Specifically, a characteristic of FIG. 1 is that a sensing region 9c of the monitor chip region 7c is disposed in the center of the chip, in the same way as the active region 1 of the device chip region 3, and the ring-like polyimide resin film 6c is formed in a peripheral region of the sensing region 9c, with the same kind of disposition as the edge region 2 of the device chip region 3. Further, the areas of one chip occupied by the polyimide resin film 6c of the monitor chip region and the polyimide resin film 6 of the device chip region are the same at 13% each of the chip area. Also, in FIG. 4, the polyimide resin film 6b is formed only in a narrow peripheral region (oblique hatching) surrounding a sensing region 9b in the vicinity of the center of the monitor chip region 7b. In FIG. 4, the areas of one chip occupied by the polyimide resin film 6b of the monitor chip region and the polyimide resin film 6 of the device chip region are 13% and 32% respectively of the chip area, which is a difference of 19%. In the invention, because no breakdown voltage defect caused by the monitor chip region occurs, whether the protective film pattern is that of FIG. 1 or FIG. 4, the protective film pattern can be selected as appropriate.

A detailed description will be given of the reason for this, referring to FIGS. 3A to 3C. FIG. 3A is a cross-sectional view of the wafer in the vicinity of the device chip region 3 and monitor chip region 7 before back surface grinding. In the same way, FIG. 3B is a cross-sectional view of each of the device chip region 3 (b1) and monitor chip region 7 (b2) and (b3) after back surface grinding. Also, FIG. 3C shows the explanation of the thickness of the silicon wafer after back surface grinding as follows: device chip region 3 (b1)>monitor chip region 7 (b3)>monitor chip region 7 (b2).

On the wafer 21 that has finished the wafer processing step flow of FIG. 2 as far as the protective film formation of steps 1 to 3 being subjected to back surface grinding in the next step 4, the effect of unevenness caused by irregularity in the vicinity of the monitor chip region on the wafer front surface side after back surface grinding is such that the net thickness of the silicon substrate decreases to that of a high region in which there is considerable front surface protruding portion irregularity. This is shown in FIG. 3B. FIG. 3B shows that, as back surface grinding is carried out so that a thickness d1 after back surface grinding in b1, a thickness d2 after back surface grinding in b2, and a thickness d3 after back surface grinding in b3 are the same, as described in FIG. 3C, the net silicon thickness is b1>b3>b2. That is, the net silicon thickness is smallest in b2. This is because the heretofore known monitor chip region 7a is in the condition of b2 in which the greater part of the area is occupied by a region wherein a protective film is formed on the silicon wafer front surface. Because of this, the net silicon wafer thickness is smallest in the monitor chip region 7a.

This time, however, it is newly described that a region in which the silicon wafer thickness is small is not only the monitor chip region 7a, but also extends to the normal device chip region 3 surrounding the monitor chip region 7a. It is found that, because of this, the net silicon thickness of the normal device chip region 3 decreases to or beyond a thickness limit determined by breakdown voltage, and breakdown voltage defects increase. Because of this, it is possible to reduce the effect of the monitor chip regions 7b and 7c on the peripheral device chip regions 3 by bringing the protective film pattern of the monitor chip regions 7b and 7c closer to the protective film pattern of the device chip region 3. The advantage of this is such that, although it is best that the protective film pattern of the monitor chip region coincides perfectly with the protective film pattern of the device chip region, as in FIG. 1, a reduction advantage is obtained provided that the pattern forms and areas occupied are close, even in the event that they do not coincide perfectly. For example, under a condition whereby the difference between the area of one chip occupied by the protective film of the monitor chip region and the area of one chip occupied by the protective film of the device chip region is set to within 20%, an advantage is obtained in that defects caused by the monitor chip region are reduced.

Herein, as the protective film is formed in the edge region in a normal device, and the area thereof is approximately 30% or less of the area of the device chip region, it is preferable that the area occupied by the protective film in the monitor chip region is also 30% or less. Also, this kind of advantage is more evident when the thickness of the silicon wafer is thinner after back surface grinding, and the chip area is greater; thereby, the invention is more effective when the breakdown voltage is lower and the chip area is greater. Specifically, the invention is effective under a condition whereby a ratio B/A between a film thickness B, wherein a protective film and metal film are stacked, and a chip thickness A is 7.7% or higher.

Next, a consideration will also be given to the etched area of a metal film fabricated in the metallization step 2 of FIG. 2 under the same conditions as in Example 1. FIG. 5 is a table showing the relationship with the occurrence of device chip region metal film pattern etching defects of device chip regions and monitor chip regions in the wafer that have differing metal film pattern types A to E. FIG. 5 shows that there is no device chip region metal film etching defect when the area of the monitor chip region metal film subjected to etching is 37.4% or less, but that etching defects occur at 77.6%.

This is because, in the type A device, almost all of the metal film in the monitor chip region other than the sensor contact region 10 is removed; thus, the chemical reaction heat when etching is high, and the peripheral device chip regions 3 are affected. As opposed to this, in the case of device types B to E, the area subjected to etching of the metal film in the monitor chip region is at most 37.4%, which differs little from that of the device chip region, because of which it is possible to suppress the reaction heat commensurately, and thus possible to reduce the effect on the etching accuracy of the device chip region metal film. Because of this, by setting the areas occupied by the metal films of the device chip region and monitor chip region at 62.6% or more each, it is possible to reduce the effect of the monitor chip region on the peripheral device chip regions when etching the metal film.

What is claimed is:

1. A semiconductor device fabricating method, comprising:
    a first step of forming device chip regions, and a monitor chip region for processing management including in a center thereof a sensing region, on a substrate surface layer in a region compartmentalized in lattice form on one main surface side of a semiconductor substrate wafer, each device chip region having a required active region and an edge region surrounding the active region;
    a second step of, after forming metal films of a required pattern on front surfaces of the device chip regions and the monitor chip region by vapor deposition and photolithography, forming protective films on the front surfaces of the device chip regions and the monitor chip region; and
    a third step of grinding and polishing another main surface side of the semiconductor substrate wafer to thin the semiconductor substrate wafer,
    wherein a difference between an area of one chip occupied by the protective film of the monitor chip region and an area of one chip occupied by the protective film of one device chip region is 20% or less.

2. The semiconductor device fabricating method according to claim 1, wherein a pattern of the protective film formed in the monitor chip region is same as a pattern of the protective film formed in the device chip region.

3. The semiconductor device fabricating method according to claim 1, wherein the protective film is formed in peripheral regions of the device chip regions and the monitor chip region.

4. The semiconductor device fabricating method according to claim 1, wherein the areas occupied by the protective film in the device chip region and the monitor chip region are each 30% or less.

5. The semiconductor device fabricating method according to claim 1, wherein the protective film is a polyimide resin film.

6. The semiconductor device fabricating method according to claim 1, wherein a film thickness of a region stacked with the metal film and the protective film formed in the second step is 10 μm or more.

7. The semiconductor device fabricating method according to claim 1, wherein a ratio after the third step between a thickness A of the semiconductor substrate wafer and a film thickness B of the region stacked with the metal film and the protective film satisfies B/A >7.7%.

8. The semiconductor device fabricating method according to claim 1, wherein areas occupied by the metal film in the device chip region and the monitor chip region are each 62.6% or more.

* * * * *

UNITED STATES PATENT AND TRADEMARK OFFICE
CERTIFICATE OF CORRECTION

PATENT NO. : 8,999,814 B2
APPLICATION NO. : 14/251086
DATED : April 7, 2015
INVENTOR(S) : Takashi Shiigi It is certified that error appears in the above-identified patent and that said Letters Patent is hereby corrected as shown below:

In the Specification,
Please change column 9, line 21, from "chip region metal. film." to --chip region metal film.--.

Signed and Sealed this
Twenty-first Day of July, 2015

Michelle K. Lee
*Director of the United States Patent and Trademark Office*